US008993217B1

United States Patent
Wang et al.

(10) Patent No.: US 8,993,217 B1
(45) Date of Patent: Mar. 31, 2015

(54) DOUBLE EXPOSURE TECHNIQUE FOR HIGH RESOLUTION DISK IMAGING

(71) Applicant: Western Digital (Fremont), LLC, Fremont, CA (US)

(72) Inventors: Ling Wang, Hercules, CA (US); Dujiang Wan, Fremont, CA (US); Miao Wang, San Jose, CA (US); Hai Sun, Milpitas, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/906,293

(22) Filed: May 30, 2013

Related U.S. Application Data

(60) Provisional application No. 61/808,283, filed on Apr. 4, 2013.

(51) Int. Cl.
*G03F 7/26* (2006.01)
*G03F 7/20* (2006.01)

(52) U.S. Cl.
CPC ............................. *G03F 7/2022* (2013.01)
USPC ............................ 430/312; 430/394; 430/5

(58) Field of Classification Search
CPC ... G03F 7/70466; G03F 7/0035; G03F 7/095; G03F 7/70283; G03F 1/30; G03F 7/70458; G03F 7/70625; G03F 9/7084; G03F 1/26; G03F 1/0061; G03F 1/32; G03F 7/203; H01L 21/31144; H01L 21/0274; H01L 21/32139; H01L 21/28123
USPC .................................................. 430/312, 394
See application file for complete search history.

(56) References Cited

U.S. PATENT DOCUMENTS

| | | |
|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |

(Continued)

OTHER PUBLICATIONS

Hongping Yuan, et al., U.S. Appl. No. 12/146,370, filed Jun. 25, 2008, 16 pages.

(Continued)

*Primary Examiner* — Caleen Sullivan

(57) ABSTRACT

Innovative techniques are disclosed for fabricating microelectronic devices using an alternating phase shift mask. Some embodiments of the invention encompass a double exposure technique that utilize high resolution line patterning such that two opaque lines intersect at an angle. After development, substantially circular images may be formed. In certain embodiments, high resolution disk imaging as small as 60 nm is possible.

20 Claims, 5 Drawing Sheets

(56) References Cited

U.S. PATENT DOCUMENTS

| | | | |
|---|---|---|---|
| 6,108,166 A | 8/2000 | Lederman |
| 6,117,622 A | 9/2000 | Eisele et al. |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,348,301 B1 | 2/2002 | Lin |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,398,430 B1 | 6/2002 | Jeoung et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,164 B1 | 9/2002 | Lyons et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,571,384 B2 | 5/2003 | Shin et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,620,559 B2 | 9/2003 | Czech et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |

(56) References Cited

U.S. PATENT DOCUMENTS

| | | |
|---|---|---|
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,774,044 B2 | 8/2004 | Ke et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,807,662 B2 | 10/2004 | Toublan et al. |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,852,453 B2 | 2/2005 | Wu |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,007 B2 | 8/2005 | Fritze et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,064,846 B1 | 6/2006 | Amblard et al. |
| 7,070,697 B2 | 7/2006 | Freitag et al. |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,258,965 B2 | 8/2007 | Frost et al. |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,384,725 B2 | 6/2008 | Minvielle et al. |
| 7,386,933 B1 | 6/2008 | Krounbi et al. |
| 7,389,577 B1 | 6/2008 | Shang et al. |

(56) References Cited

U.S. PATENT DOCUMENTS

| | | | |
|---|---|---|---|
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |

(56) References Cited

U.S. PATENT DOCUMENTS

| | | |
|---|---|---|
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 2003/0039893 A1 | 2/2003 | Farnsworth et al. |
| 2003/0124847 A1* | 7/2003 | Houston et al. ............ 438/689 |
| 2008/0020296 A1 | 1/2008 | Hsu et al. |
| 2010/0290157 A1 | 11/2010 | Zhang et al. |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

OTHER PUBLICATIONS

Wei Gao, et al., U.S. Appl. No. 13/115,621, filed May 25, 2011, 21 pages.

* cited by examiner

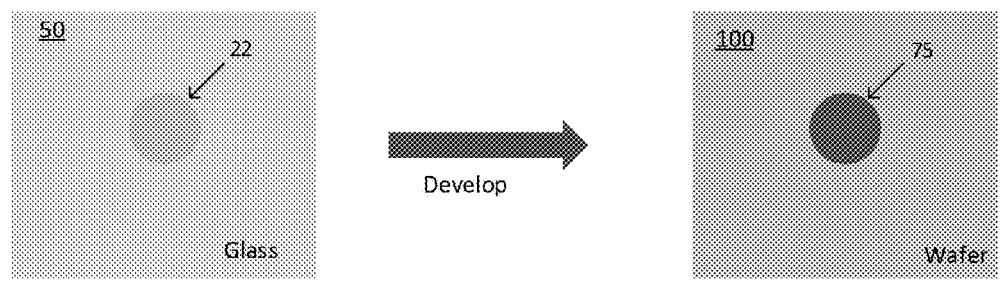
Prior Art
FIG. 1
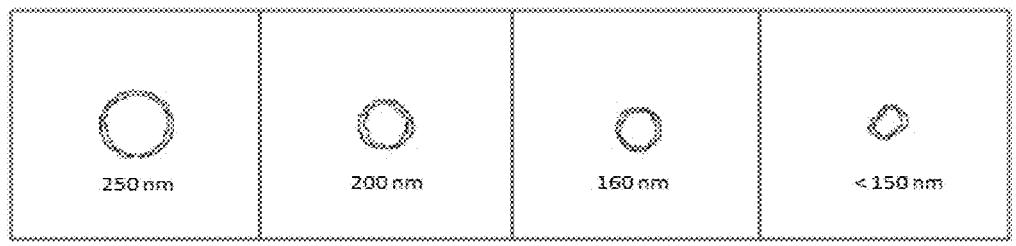
FIG. 2A     FIG. 2B     FIG. 2C     FIG. 2D
Prior Art
FIG. 2

DOUBLE EXPOSURE TECHNIQUE FOR HIGH RESOLUTION DISK IMAGING

CROSS-REFERENCE TO RELATED APPLICATION

This application claims priority to U.S. Provisional Patent Application No. 61/808,283 entitled "Double Exposure Technique For High Resolution Disk Imaging" filed on Apr. 4, 2013 for Ling Wang et al. which is incorporated herein by reference.

BACKGROUND

High resolution fine patterning is an important process for device fabrication. FIG. 1 illustrates the conventional method for producing an isolated image on a photoresist which involves using a chrome on glass mask (COG) 50 with a chrome dot 22. A single exposure is performed through COG mask 50 to transfer a dot image to the substrate. For a positive photoresist on a wafer, the chrome dot will block a region from being exposed. After development, a dot 75 is formed at the unexposed region of the wafer 100 as shown in FIG. 1.

Future generations of microelectronic devices necessitate smaller critical dimensions. The dots produced by the method of FIG. 1 gradually become deformed as they are scaled to smaller sizes. FIGS. 2A-2D illustrate images obtained using the conventional process of FIG. 1. FIG. 2A depicts a relatively smooth dot of 250 nm diameter. Similarly, a smooth dot having a size of 200 nm (FIG. 2B), and as low as 160 nm (FIG. 2C) can also be formed using the prior method. At just below 150 nm, dots produced by the process of FIG. 1 begin to show distortion as indicated by FIG. 2D. Thus, FIGS. 2A-2D demonstrate that the images developed with the prior method become deformed as the resolution is decreased below 150 nm. Therefore, a new method is needed for achieving an isolated image on a photoresist for microelectronic fabrication.

BRIEF DESCRIPTION OF THE DRAWINGS

FIG. 1 illustrates a conventional method for producing a pattern on a wafer.

FIGS. 2A-2D illustrate a sequence of images produced by a prior art method.

DETAILED DESCRIPTION

Representative embodiments of the invention will now be described in association with FIGS. 3-7. FIGS. 3-7 are not drawn to the scale of an actual device or system, and are merely illustrative of the embodiments described herein.

Figure 3:
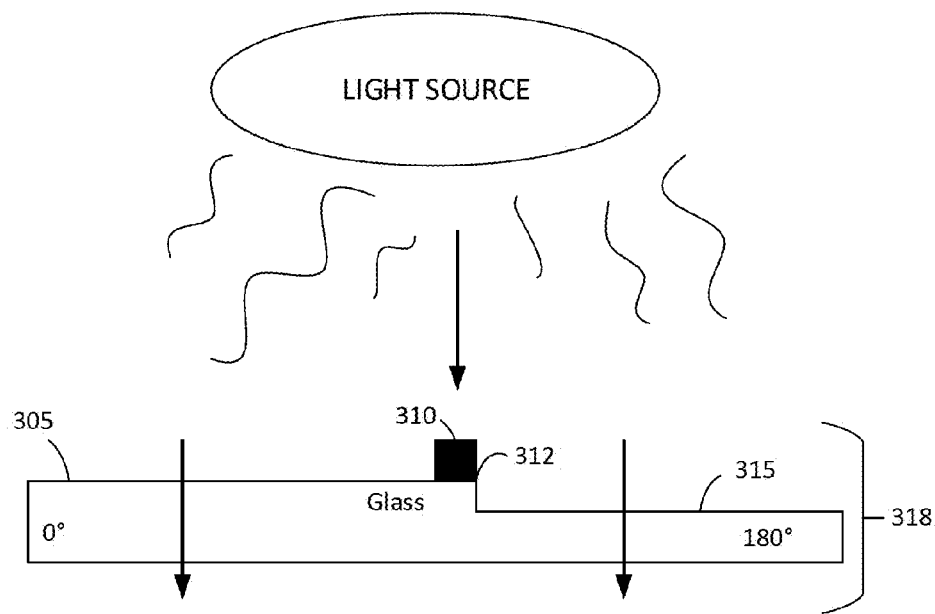
FIG. 3 is a diagram of an imaging system using an alternating phase shift mask.
Figure 3:
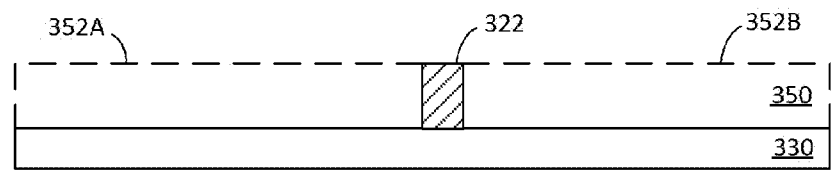

FIG. 3 illustrates an imaging system suitable for implementing the invention. The imaging system comprises a light source, a mask 318 and a wafer 330. Photoresist 350 is coated onto wafer 330 for further processing. In certain embodiments, mask 318 is an alternating phase shift mask (alt-PSM) comprising a quartz material and an opaque area 310. The quartz material has a thick region 305 and a thin region 315 bounded on one side by opaque area 310. Opaque area 310 marks a transition 312 between the phase shifts of thick region 305 and thin region 315 on alt-PSM 318. The electric field transmitted by thin region 315 is out of phase by 180° by that transmitted by thick region 305. In several embodiments, opaque area 310 comprises chromium. However, in other embodiments, opaque area 310 may comprise any other metallic or opaque material.

During exposure, the pattern of alt-PSM 318 is projected onto photoresist 350. As indicated by FIG. 3, light energy of a suitable image radiation is transmitted through transparent regions 305, 315 to contact photoresist 350. Light transmitted through alt-PSM 318 enters photoresist 350 at regions 352A and 352B. As photoresist 350 is a positive resist, portion 352A and portion 352B will be stripped away some time after development. Opaque area 310 on mask 318 prevents light from transmitting through portion 322. Unexposed portion 322 remains after development. and contains an image of the pattern transferred by alt-PSM 318.

Figure 4A:
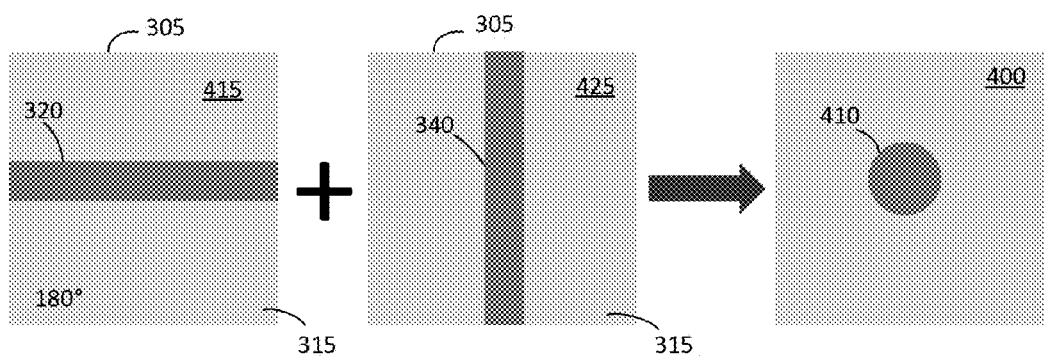
FIG. 4A illustrates a method for producing an image in accordance with one embodiment of the invention.
Figure 4B:
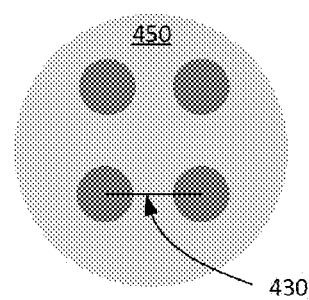
FIG. 4B illustrates a pattern formed by a process of the invention.

An embodiment of the invention will now be discussed in association with FIGS. 4A and 4B. FIG. 4A illustrates an embodiment of the disclosure wherein a high resolution image 410 is formed on a substrate 400 using mask 415 and mask 425. Each mask can be an alt-PSM. In certain embodiments, mask 415 has an opaque line 320 and mask 425 has an opaque line 340. Although only one opaque line 320 is shown on phase shift mask 415 and one opaque line 340 is shown on phase shift mask 425, it is understood that several embodiments of the disclosure are directed to phase shift masks that include more than one opaque line. Thus, any reference to a single opaque area is not intended to limit the disclosure to embodiments comprising a mask with solely a single opaque line.

A photoresist (not shown) is provided on a substrate, such as a wafer (not shown). A first phase shift mask 415 with multiple line-shaped opaque areas is placed over the photoresist. Then a suitable image radiation is provided by a light source to expose the photoresist with the pattern on mask 415. A portion of the substrate may be exposed multiple times in a stepper to obtain the desired images. During exposure, opaque areas of the first mask 415 cause first regions of the photoresist to remain unexposed. The first mask 415 is then replaced with a second phase shift mask 425. Similar to the first mask, the second mask 425 has multiple line-shaped opaque areas. In one embodiment, opaque lines on mask 415 and mask 425 have line widths of approximately 50-150 nm. In some embodiments, the line widths of both masks are equal.

In certain embodiments, the opaque line 340 of second mask 425 is placed over the resist in a direction substantially perpendicular to the major axis of first opaque line 320 to cause second regions of the photoresist to remain unexposed in the second exposure. Chromium (chrome) is a suitable material for the opaque lines, although other metals can also serve as the opaque area on the glass mask. Light is blocked from entering the resist regions in both exposures where the chrome lines of mask 415 and 425 intersect. By employing transparent regions 305, 315 with respective phase shifts of 0 and 180 degrees, the light diffracted into chrome lines 320 and 340 between these adjacent transparent areas 305, 315 interfere destructively (to cancel out each other), resulting in the chrome areas blocking the underlying photoresist portions from the light source during exposure. The photoresist exposed through the second mask 425 forms multiple latent images at the intersection of the unexposed areas. For simplicity, only a single latent image 410 is shown as being produced in FIG. 4A.

After the double exposure, latent images appear in regions that are unexposed due to light being blocked by opaque lines 320, 340. The photoresist is then developed and a plurality of substantially circular disks is formed. In summary, the double exposure creates one or more island images in resist and the optical proximity effects naturally round the four corners to make the island a perfect or near-perfect circular disk.

Although FIG. 4A illustrates an embodiment using two phase shift masks, the process of FIG. 4A can be implemented with a single phase shift mask (PSM) instead. In such an embodiment, chrome lines 320 and 340 appear in different regions of the same PSM.

A step-and-repeat apparatus (stepper) exposes the full pattern of the mask by sequentially stepping each field of wafer 450 during each exposure. After the first and second exposure, a pattern of disks is formed as illustrated in FIG. 4B. Each disk in FIG. 4B has a pitch 430 of approximately 0.5 microns, where the pitch 430 is measured from the center of one disk to the center of an adjacent disk. Moreover, in certain embodiments a disk having a pitch of 1-20 microns is also possible. Yet in other embodiments the disk can have a pitch of 25-100 microns. Still, it is possible to form disks having a pitch of approximately 100-300 microns. In certain embodiments, the disks produced are relatively isolated, in that patterned features are absent between a majority of the disks.

Embodiments of the present disclosure can result in images that are scalable to a smaller degree than the images shown in FIGS. 2A-2D. One advantage that can be achieved with certain embodiments is an improved contrast image. Although light intensity increases when feature sizes become smaller in these embodiments, the fine pattern retains its resolution because it is formed within the sensitivity parameters of the photoresist.

Figures 5A, 5B, 5C, 5D:
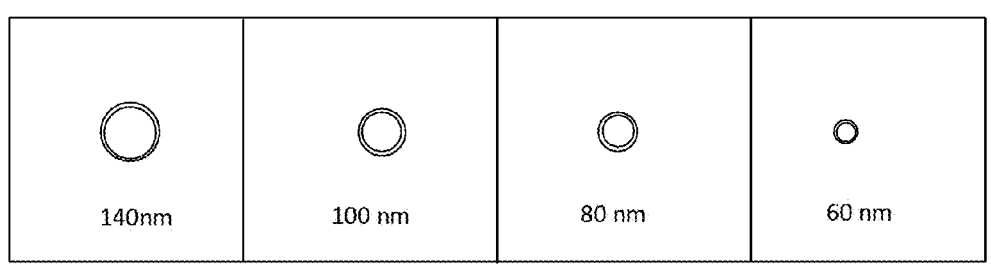
FIGS. 5A-5D illustrate a sequence of scalable images produced in accordance with one embodiment of the invention.

On the other hand, an enhanced image is produced by implementing several embodiments of the present invention. For example, FIGS. 5A-5D illustrate the scalability of the images obtained by following certain embodiments of the invention. Unlike in the prior art, the image obtained at 140 nm is smooth and remains smooth as it is scaled to 100 nm (FIG. 5A), 80 nm (FIG. 5C) and even down to 60 nm (FIG. 5D).

After development, the pattern of images obtained in several embodiments of the invention has a pitch of at least 0.5 microns. The pitch in these embodiments can be as large as 300 microns or greater, and will generally have a constant pitch with a high contrast image. Moreover, in certain embodiments associated with FIGS. 5A-5D, a disk having a pitch of 1-20 microns is also possible. Yet in other embodiments the disk can have a pitch of 25-100 microns. Still, it is possible to form disks having a pitch of approximately 100-300 microns. In the aforementioned embodiments, the disks produced are relatively isolated, in that intervening structures are not present between at least a majority of disks.

Figure 6A:
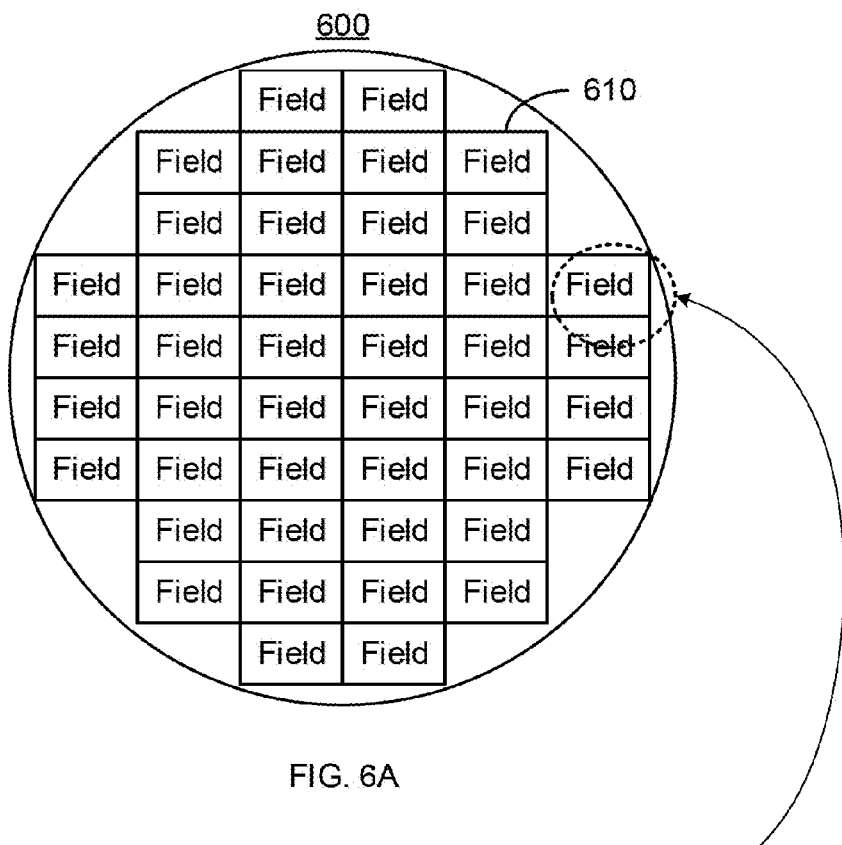
FIGS. 6A and 6B illustrate a diagram of an embodiment of the invention that uses a single mask to pattern the photoresist.
Figure 6B:
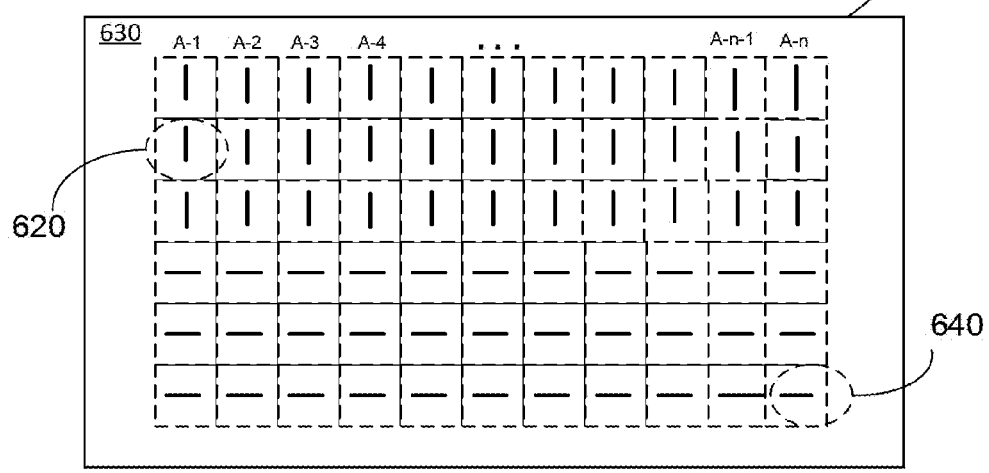

Turning to FIGS. 6A and 6B, an example of how PSM line imaging is used to form patterns on a photoresist will now be explained. The substrate to be patterned is shown as a wafer 600 in FIG. 6A. Wafer 600 is divided into fields 610 that will be patterned by mask 630 of FIG. 6B. Mask 630 is an alt-PSM with multiple opaque lines that block light from penetrating the photoresist during exposure. One possible way of laying out the opaque lines on alt-PSM 630 is shown in FIG. 6B. The upper half of alt-PSM 630 includes opaque lines 620 oriented vertically, while the lower half of alt-PSM 630 has opaque lines 640 oriented horizontally. In certain embodiments, the opaque lines are chrome lines.

Numerous other configurations for locating the chrome lines in the mask(s) of the present invention are possible. For example, a column of horizontal lines 620 can alternate with a column of vertical lines 640. Alternatively, a group of vertical chrome lines can be interspersed with a group of horizontal chrome lines. The line width of each line will vary based on the feature to be patterned. However, in one embodiment suitable line widths can range from approximately 50 nm to approximately 150 nm.

In the embodiment of FIGS. 6A-6B, a photoresist is coated on a wafer, and the coated wafer is placed in a stepper, and then alt-PSM 630 is provided above the photoresist. During the first exposure, a light source illuminates the mask through the photoresist to expose a portion of the wafer. Then alt-PSM 630 is shifted to a new column (one of either A-2, A-3, A-4, . . . A-n−1 or A-n) and the exposure process is repeated. Due to the chrome lines of alt-PSM 630, portions of the photoresist are unexposed during the first exposure. Then the photoresist is exposed again by shifting the mask to a region where the chrome lines are oriented horizontally. Alt-PSM 630 is positioned so that the horizontal chrome lines overlap the vertical chrome lines of the first exposure.

In one embodiment, the chrome lines are oriented at a right angle to each other. And then a second exposure is performed. The resulting unexposed areas form a latent image of substantially circular disks. After development, substantially circular disks are formed.

In other embodiments, a fine pattern of alternate shapes is also feasible. One process for these other embodiments is summarized in FIG. 7, where either a single alt-PSM or multiple alt-PSMs may be used. First, a photoresist is placed on a substrate to form a coating via block 750. Then a first alt-PSM having a chrome line is placed in a first position on the substrate in block 752. In several embodiments, opaque area in blocks 752 and 756 comprise chrome lines. However, in other embodiments, the opaque line may comprise any other metallic or opaque material lines having a line width ranging from approximately 50 nm to approximately 150 nm.

Afterwards, the coating is exposed through the mask in block 754. During the first exposure, the chrome line on the first alt-PSM prevents portions of the photoresist from being exposed. Thereafter, the first mask on the photoresist is replaced with a second alt-PSM, also having an opaque area, such as a chrome line. In block 756, the chrome line of the second alt-PSM is oriented at an angle α, relative to the chrome line of the first mask, wherein α is ≥30 degrees and ≤90 degrees. During the second exposure, in block 758, additional portions of the photoresist are exposed. At the intersection of unexposed portions maintained by the first and second exposure, latent images are formed. The process proceeds to block 760, wherein the latent images are developed to form a pattern of high resolution images.

The pattern formed by process 700 will depend on the angle of block 756. When opaque lines of the alt-PSMs are oriented at 45 degrees relative to each other, substantially elliptical images are formed on the substrate. In the case where two alt-PSMs have their opaque lines oriented at a right angle to each other, substantially circular images are produced. The opaque lines of FIG. 7 can have a line width ranging from approximately 50 nm to approximately 150 nm.

Figure 7:
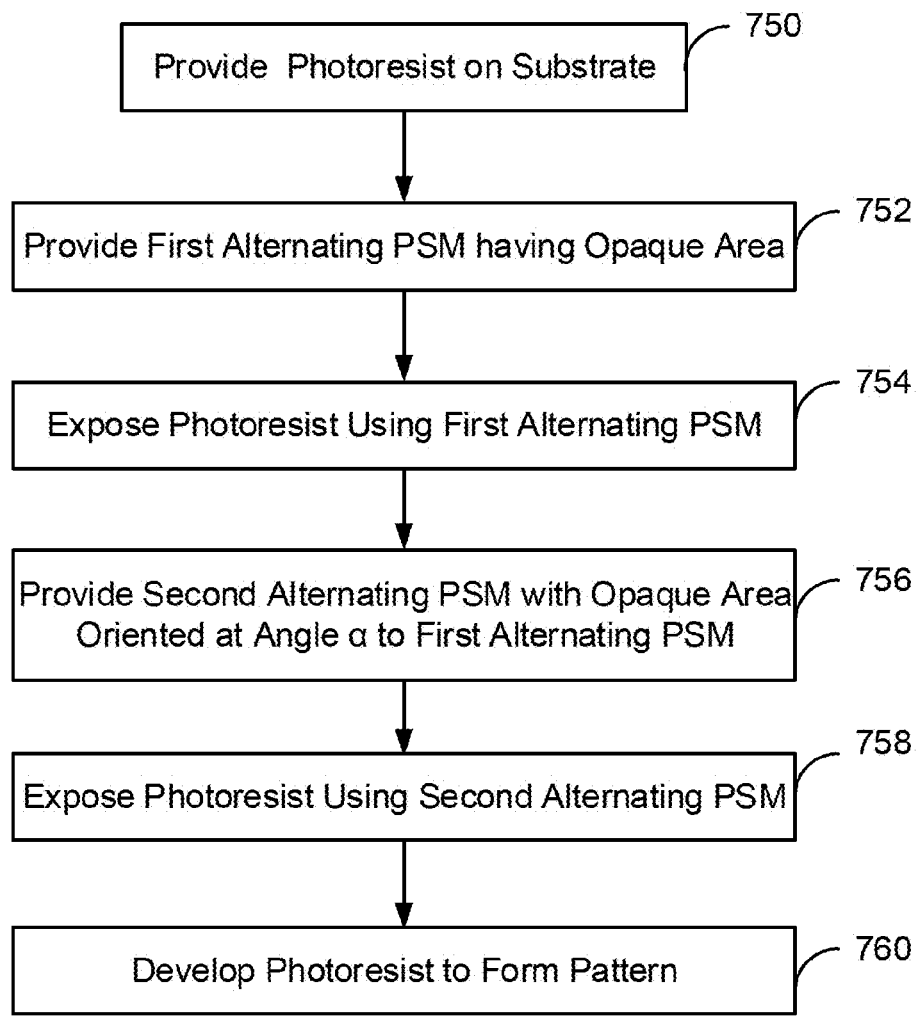
FIG. 7 is a flowchart illustrating an embodiment for producing a pattern.

Although FIG. 7 describes two alt-PSMs, the process of FIG. 7 can be implemented with only a single mask. In such an embodiment, one group of chrome lines is disposed horizontally on the mask, and a second group of chrome lines is disposed vertically in a different region of the same mask.

The innovative techniques described above can be applied to fabricate future generations of near-field optical transducers, MEMS, semiconductors, and any other high resolution disk imaging applications.

The above detailed description is provided to enable any person skilled in the art to practice the various embodiments described herein. While several embodiments have been described, it should be understood that these are for illustration purposes only and should not be taken as limiting the scope of the invention.

Various modifications to these embodiments will be readily apparent to those skilled in the art, and generic principles defined herein may be applied to other embodiments. Thus, many changes and modifications may be made to the above embodiments, by one having ordinary skill in the art, without departing from the spirit and scope of the invention.

We claim:

1. A method of forming a pattern of images on a substrate, the method comprising:
    providing a photoresist on the substrate;
    providing a mask having a first line segment oriented in a first position and a second line segment oriented in a second position substantially perpendicular to the first position, wherein each line segment comprises an opaque material that blocks light from penetrating the photoresist;
    performing a first exposure of the photoresist through the mask, wherein a first region of the photoresist is unexposed after exposure;
    performing a second exposure of the photoresist through the mask, wherein a second region of the photoresist is unexposed after exposure, and wherein said mask comprises an alternating phase shift mask.

2. The method of claim 1, wherein the line segments have a line width of approximately 50-150 nm.

3. The method of claim 1, wherein the mask is shifted between the first exposure and the second exposure.

4. The method of claim 1, further comprising developing the photoresist to form a plurality of substantially circular disks, wherein each substantially circular disk corresponds to an unexposed region.

5. The method of claim 4, wherein each substantially circular disk has a resolution of 60 nm or less.

6. The method of claim 1, wherein the pattern has a pitch of at least 0.5 microns.

7. The method of claim 1, wherein the pattern has a pitch of approximately 25 to approximately 100 microns.

8. The method of claim 1, wherein the opaque material of said first phase shift mask comprises chromium.

9. The method of claim 1, wherein the mask comprises a first transparent area that has a phase shift of 0 degrees and a second transparent area that has a phase shift of 180 degrees, wherein light is transmitted through each transparent area.

10. A method of forming a fine pattern on a substrate comprising:
    providing a photoresist on a substrate;
    providing a first mask having first and second transparent areas with phase shifts of 0 degrees and 180 degrees respectively, and a first opaque area;
    exposing the photoresist through the first mask, wherein the first opaque area blocks light from entering the photoresist, resulting in a first unexposed region;
    providing a second mask having first and second transparent areas with phase shifts of 0 degrees and 180 degrees respectively, and a second opaque area;
    placing the second opaque area of the second mask in a direction substantially perpendicular to the first opaque area of the first mask resulting in a second unexposed region;
    exposing the photoresist through the second mask to form a latent image at the intersection of the first and second unexposed regions, wherein said first mask and said second mask comprise an alternating phase shift mask; and
    developing the photoresist to form a fine pattern of images, each image having rounded corners and a pitch of at least 0.5 microns.

11. The method of claim 10, wherein each opaque area comprises a line segment having a width of approximately 50-150 nm.

12. The method of claim 10, wherein the fine pattern obtained after development has a resolution of 60 nm or less.

13. The method of claim 10, wherein the first and second opaque areas comprise chromium.

14. A method of forming a high resolution image on a substrate, the method comprising:
    providing a photoresist on the substrate to form a coating;
    providing a first mask having an opaque area in a first position to block a first region of the photoresist from being exposed;
    performing a first exposure of the coating through the first mask;
    providing a second mask having an opaque area in a second position to block a second region of the photoresist from being exposed, wherein the second region is oriented at an angle α, relative to the first region of the first mask, wherein α is ≥30 degrees and ≤90 degrees;
    performing a second exposure through the second mask, wherein said first mask and said second mask comprise an alternating phase shift mask and wherein the same dosage is used for the first and second exposure and
    developing the photoresist to form a pattern of images, each image having rounded corners and a pitch of at least 0.5 microns.

15. The method of claim 14, wherein developing the photoresist forms a substantially elliptical image at the intersection of the first and second unexposed regions when α is 45 degrees.

16. The method of claim 14, wherein developing the photoresist forms substantially circular disks at the intersection of the first and second unexposed regions when α is 90 degrees.

17. The method of claim 14, wherein the opaque area of the first mask has a width dimension that is substantially equal to a width dimension of the opaque area of the second mask.

18. The method of claim 14, wherein the opaque area of the first mask has a length dimension that is substantially equal to a length dimension of the opaque area of the second mask.

19. The method of claim 14, wherein the fine pattern has a pitch of approximately 25-100 microns.

20. The method of claim 14, wherein the fine pattern has a pitch of approximately 100-300 microns.

* * * * *